US005319156A

United States Patent [19]

Fonteneau et al.

[11] Patent Number: 5,319,156

[45] Date of Patent: Jun. 7, 1994

[54] SHIELDED ELECTRICAL CONNECTOR

[75] Inventors: Michel Fonteneau, Le Mans; Christian Jarry, la Bazoge, both of France

[73] Assignee: Souriau Et Cie, Versailles, France

[21] Appl. No.: 932,182

[22] Filed: Aug. 21, 1992

[30] Foreign Application Priority Data

Aug. 27, 1991 [FR] France ................................ 9110627

[51] Int. Cl.[5] .......................... H05K 9/00; H01R 9/03

[52] U.S. Cl. .................................. 174/35 R; 361/816; 439/609; 439/610

[58] Field of Search ........ 361/424; 174/35 R, 35 MS, 174/35 C; 439/607, 608, 609, 610

[56] References Cited

U.S. PATENT DOCUMENTS

| | | | |
|---|---|---|---|
| 4,457,576 | 7/1984 | Cosmos et al. | 174/35 C |
| 4,653,836 | 3/1987 | Peele . | |
| 4,662,700 | 5/1987 | Markham | 29/857 |
| 4,689,723 | 8/1987 | Myers et al. . | |

FOREIGN PATENT DOCUMENTS

| | | |
|---|---|---|
| 0427630 | 5/1991 | European Pat. Off. . |
| 8505230 | 11/1985 | World Int. Prop. O. . |

*Primary Examiner*—Leo P. Picard
*Assistant Examiner*—Bot Ledynh
*Attorney, Agent, or Firm*—Wegner, Cantor, Mueller & Player

[57] ABSTRACT

An overmolded electrical connector including an insulative block, the insulative block receiving connecting members and being mechanically joined to a rear connection housing, the insulative block being protected by a first metal half-shell and a second metal half-shell adapted to be coupled together to form a shielded housing having electrical continuity with the rear connection housing, the rear connection housing being overmolded with an insulative material jacket. Both the first metal half-shell and the second metal half-shell are twinned and include a female member and a male snap-fastener member for coupling the first metal half-shell and the second metal half-shell together in pairs. At least one of the female member of the first metal half-shell, the male snap-fastener member of the first metal half-shell, the female member of the second metal half-shell and the male snap-fastener member of the second metal half-shell includes an area which is at least in-part elastically deformable and adapted to face an aperture formed in the complementary member of the complementary metal half-shell. At least one of the female member of the first metal half-shell and the female member of the second metal half-shell includes a flexible tang cut out from a lateral skirt of the corresponding metal half-shell and a seat for snap-fastener engagement with the male member of the complementary metal half-shell, the flexible tang having a two-fold attachment and vent function.

12 Claims, 3 Drawing Sheets

SHIELDED ELECTRICAL CONNECTOR

BACKGROUND OF THE INVENTION

1. Field of the Invention

The invention concerns a shielded electrical connector in the form of an insulative block provided with compartments adapted to receive electrical contact members housed in a shielded housing comprising two metal half-shells having complementary coupling means, the casing being intended to be overmolded with an insulative material.

2. Description of the Prior Art

Electrical connectors of the above design are described and shown in the documents FR-2 654 558 and EP-A-0 180 594 which provide a full treatment of the design of this equipment and the problems raised by its manufacture. These problems include industrial constraints but also and more importantly problems relating to the electrical continuity of the shielding and to the mechanical strength of the housing when subject to the injection molding pressure when the insulative material is overmolded onto it.

According to the document FR-2 654 558, the mechanical strength problem is apparently solved by a housing in the form of two stamped metal half-shells a "lower" one of which is provided with a lateral skirt nesting in the "upper" half-shell, the rear part of the peripheral wall of which is provided with openings into which clip locking lugs of complementary shape provided on the rear surface of the skirt of the opposite half-shell.

The two half-shells have at the rear a semi-cylindrical part for the electrical conductors to pass through surrounded in the assembled position by a crimping ferrule. Here mechanical strength and good electrical continuity to achieve the required shielding against interference is provided by stiffening ribs pressed into each half-shell and by the partial interengagement of said shells which incorporate a ledge against which the edge of the skirt on the opposite half-shell bears.

The shielded housing is joined t the standardized rear housing comprising the insulative block by indenting the free edges at the front of the half-shells. Claw-like folded lugs obtained by cutting/stamping and then work hardening are arranged at regular intervals along the entire length of these free edges and, when the two housings are coupled together, cooperate with respective notches provided in the flange of the rear housing.

Despite this design, there is a high risk of the shells of the shielded housing being deformed by the injection molding pressure during overmolding of the insulative material with consequent transmission of forces to the parts of the insulative block (leading to breakdown and short-circuiting) if no leakage path is provided to act as a pressure limiter and to regulate temporary pressure rises during molding.

Furthermore, although the shells have some degree of symmetry, they cannot be arbitrarily substituted for each other because they are of complementary design (male and female) and necessarily require differently conformed cutting tools, in particular punches.

According to the document EP-A-0 180 594 the problem of the mechanical strength of the shielded housing during overmolding of the insulative material is solved by pressure relief vents in the form of flaps obtained by cutting the back of the shells in a figure that is not closed. If the molding pressure is within permissible limits, the flaps remain in the same plane as the back (to oppose the intrusion of plastics material into the housing). However, if the pressure crosses a critical threshold, the flaps are pushed back towards the interior of the housing by pivotting about the uncut portion to allow a quantity of the material to be extruded into the interior of said housing. This design enables a pressure regulation effect but does not, however, authorize strict control of the mass of material flowing into the interior of the housing with the risk, in the case of high pressure, of affecting the electrical connections, in particular the insulative sheaths of the electrical conductors connected to the connecting members, or of modifying the position of the connecting terminals.

An object of the invention is to alleviate the drawbacks encountered with the prior art equipment.

SUMMARY OF THE INVENTION

The present invention consists in an overmold electrical connector of the type comprising an insulative block receiving connecting members and mechanically joined to a rear housing, said insulative block being protected by two metal half-shells adapted to be coupled together to form a shielded housing having high mechanical strength and good electrical continuity with the rear connection housing, said housing being overmolded with an insulative material jacket, in which connector:

the two half-shells are twinned and each comprises a female member and a male snap-fastener member for coupling them together in pairs, one of the two members of a half-shell comprising an area which is at least in part elastically deformable adapted to face an aperture formed in the complementary member of the other half-shell, and the female member comprises a flexible tang cut out from the lateral skirt of the half-shell and comprising a seat for snap-fastener engagement with the male member of the other half-shell, said tang having a two-fold attachment and vent function.

According to one feature of the invention, the half-shells are provided, near their front free edge, with at least one groove cooperating with one or more tenons on the rear housing.

In a preferred embodiment the female member comprises a flexible tang cut out from the lateral wall of the half-shell and has a seat for snap-fastener engagement with the male member of the mated half-shell, this tang having a two-fold "fastening" and "vent" function.

The snap-fastener seat is advantageously provided by an oblong reinforcement obtained by stamping and depressing the metal towards the interior of the half-shell.

According to one feature of the invention the male member comprises a snap-fastener stud projecting from the inside surface of the lateral wall of a half-shell positioned so that in the coupled together position it faces the reinforcement of the flexible tang of the other half-shell, an aperture formed in the lateral wall of the first half-shell, in line with the snap-fastener stud, communicating with the female flexible tang of the second half-shell, so that in the event of an overpressure when injection molding the overmolded insulative material jacket this tang yields towards the interior of the housing to serve as a pressure regulator by allowing a controlled quantity of material to flow inside the housing without compromising the electrical connections.

According to another preferred feature of the invention electrical continuity between the shielded housing and the rear housing is obtained by clean direct contact of the front free edge of the half-shells with the rear side of the housing, this contact being rendered positive by the locking of the tenons of said rear housing into the grooves formed at this front edge.

Other features and advantages of the invention will emerge from the following description and the appended drawings.

DETAILED DESCRIPTION OF THE INVENTION

Figure 1:
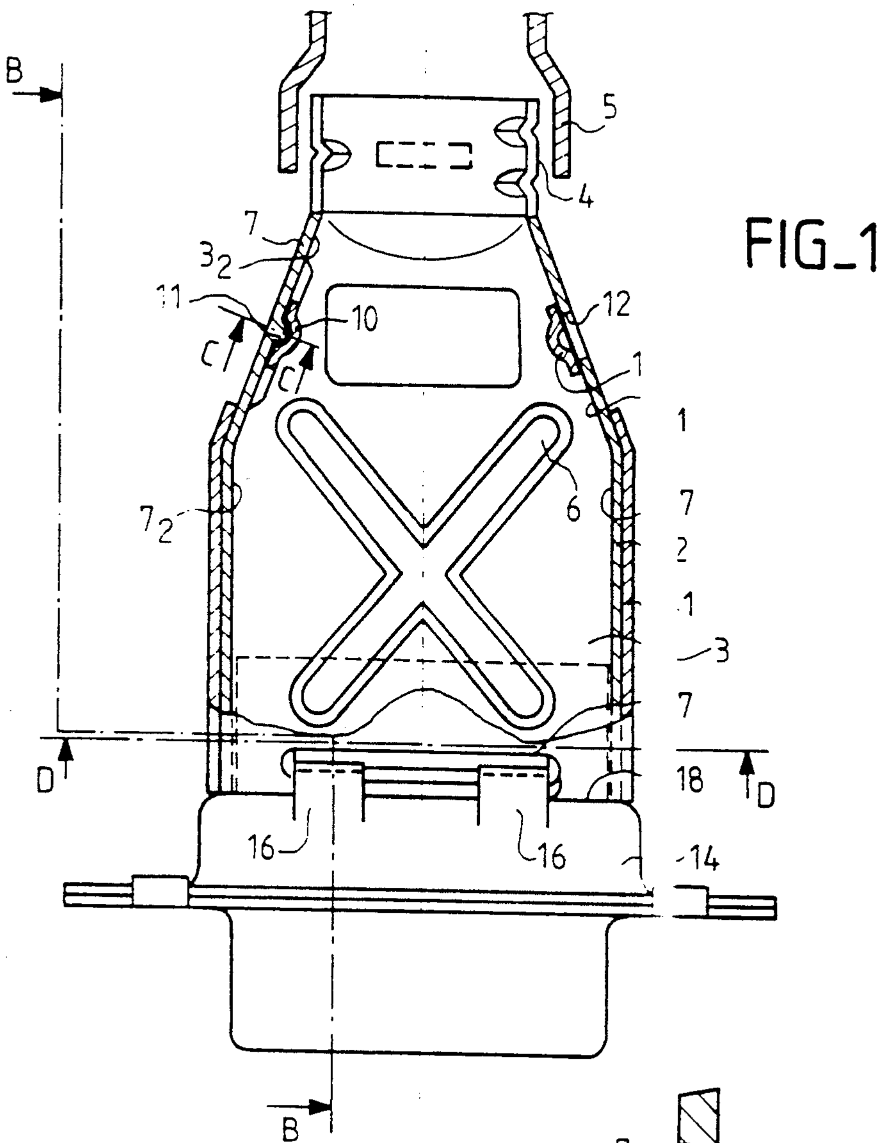
FIG. 1 is a view in cross-section on the line AA in FIG. 2.

Referring to FIGS. 1 through 5 the shielded electrical connector comprises two metal half-shells 1, 2 obtained by cutting and stamping and adapted to be coupled together in pairs to form a hollow body exhibiting high mechanical strength and good electrical continuity.

The two half-shells are symmetrical, in other words twinned, and hermaphroditic, each comprising at least one male member and one female member so that coupling them together in superposed positions respectively places the male member of one half-shell in front of the female member of the other half-shell and vice versa.

The mechanical strength of the shielded housing depends on the two half-shells being positively locked together in the assembled position and on there being a pressure regulator arrangement to enable controlled leaking of the injected material forming the overmolded insulation if the injection molding pressure exceeds a critical threshold likely to distort or separate the two half-shells. This two-fold "attachment" and "vent" function is achieved concomittantly by the complementary coupling members of the two half-shells.

The structure of one half-shell will now be described given that the other is strictly symmetrical to it.

Each half-shell is in the form of a substantially plane metal side 3 having at the rear two convergent inclined edges $\mathbf{3}_1$, $\mathbf{3}_2$ merging with a semi-circular part 4 adapted to receive, after the shielded housing is assembled, a crimping ferrule 5 encircling the electrical conductors. The side 3 is advantageously stiffened by stamped ribs 6, here in a cruciform arrangement. This design causes uniform distribution of the forces exerted on the shielded housing.

The side 3 is extended by a skirt 7 (FIG. 5) in a plane substantially perpendicular to said side 3, said skirt flanking the two parallel lateral sides $\mathbf{7}_1$ and $\mathbf{7}_2$ (FIG. 1) and the inclined edges $\mathbf{3}_1$ and $\mathbf{3}_2$ of said side which merge with the semicircular part 4 of each half-shell.

Figure 3:
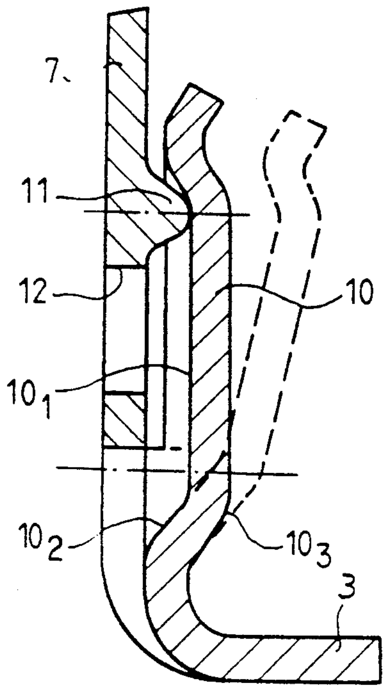
FIG. 3 is a view in cross-section on the line CC on FIG. 1.
Figure 5:
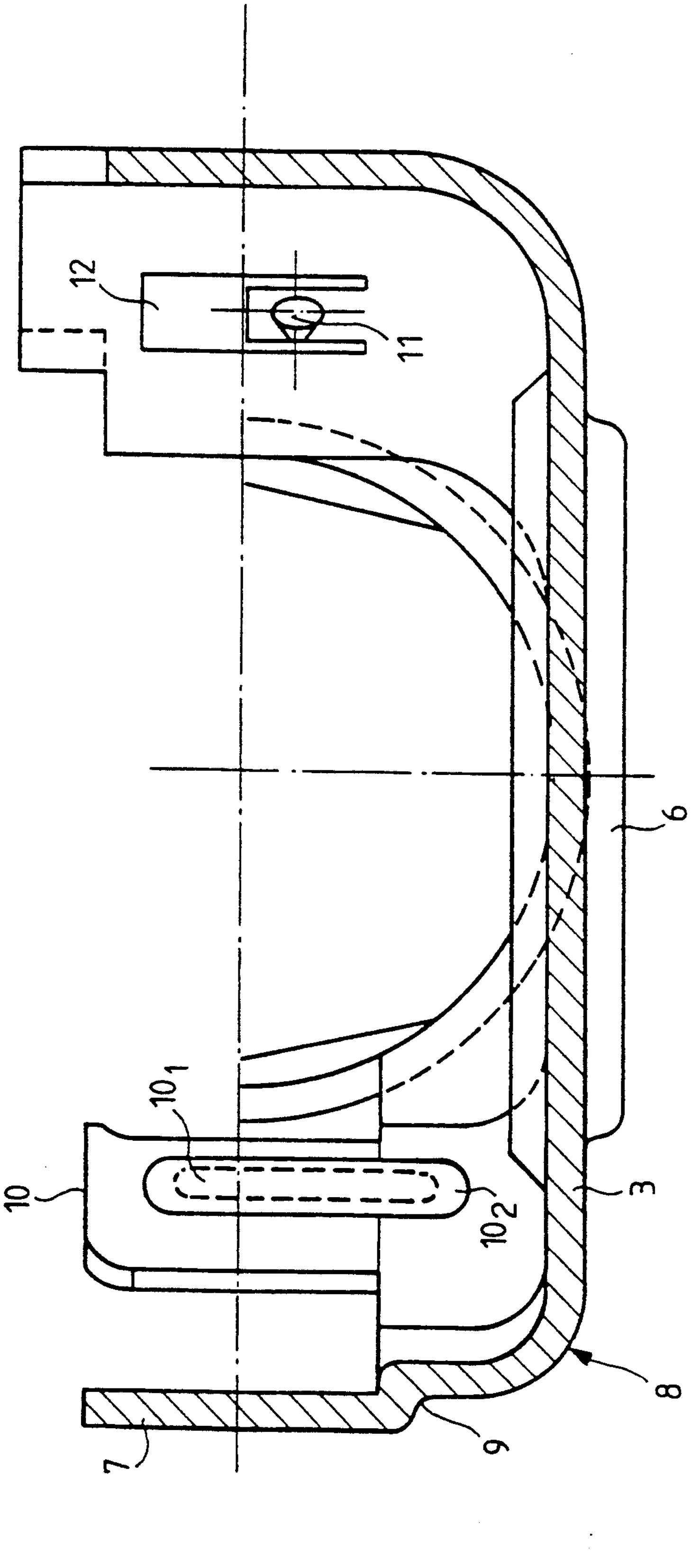
FIG. 5 is a view in transverse cross-section on the line DD in FIG. 1.

As seen in FIG. 5, the side of the half-shell merges with its orthogonal skirt 7 through a radius 8 and a shoulder 9. The male and female coupling members of each half-shell comprise, as shown in FIG. 5, an elastically deformable tang 10 constituting the female member and a snap-fastener stud 11 constituting the male member. The tang 10 is formed by a projecting lug cut out from the lateral skirt of each half-shell, the latter comprising (as seen in FIG. 3 which is a cross-section on the line CC in FIG. 1) a reinforcement or "inset" $\mathbf{10}_1$ formed by stamping and depressing the material towards the interior of the shell. This cavity is oblong with a flat back and its edge $\mathbf{10}_2$ is outwardly flared. In the area where the tang 10 merges with the back of the half-shell, it forms an articulation area $\mathbf{10}_3$ promoting, in the event of an overpressure during the injection molding of the insulative material which covers all of the shielded housing instantaneous initiation of the "vent" function by movement of the tang 10 towards the interior of the housing (as shown in dashed line in FIG. 3) if the molding pressure exceeds a permissible threshold.

The cavity $\mathbf{10}_1$ of the deformable tang 10 also provides means of fastening the two half-shells together by providing a seat for the snap-fastener stud 11 constituting the male member which, as the two half-shells are assembled together and by virtue of its elasticity, slides over the lateral wall of the skirt of the opposite half-shell to engage positively in the cavity $\mathbf{10}_1$. The snap-fastener stud is advantageously a conical boss with an oval base. It is obtained by depressing the material towards the interior of the shielding housing by a blow from a punch.

The part of the skirt including the snap-fastener stud 11 also includes an aperture 12 serving as a pressure regulator during overmolding of the insulative material, this substantially rectangular aperture being formed in line with the snap-fastener stud so that, in the mated position of the two half-shells, it faces the cavity $\mathbf{10}_1$ of the flexible tang 10 of the other half-shell. The aperture is intended to allow free passage of the injected material towards the interior of the housing so that it can flow freely and expand into the cavity $\mathbf{10}_1$ of the tang 10 if the molding pressure does not exceed a critical threshold. In this eventuality the tang is normally applied against the snap-fastener stud 11 and the material is controlled and localized in the cavity $\mathbf{10}_1$ of this tang.

If the pressure rises unacceptably, that is if it is likely to distort the housing and to damage the electrical connections that it encloses, the deformability or the strength of the flexible tang 10 is such that it retracts towards the interior of the housing, yielding around its articulation point $\mathbf{10}_3$ to allow a small quantity of material to flow into the housing in order to regulate the overmolding pressure. The quantity of material entering the housing is small because in the case of small components such as this, the mass of material injected to form the insulative jacket in which the shielded housing is surrounded is also small. In any event, this leakage path allows only a small quantity of material to infiltrate the housing and this is unable to damage the electrical connections which are far away from the location of this leak or alter the positions of the connecting terminals of the insulative block 13 (FIG. 2) enclosed in the shielded housing and connected to the rear connection housing 14.

The plane 15 on which the two half-shells mate together is not linear but comprises a step 15 for the part of the skirt comprising the spring tang 10 forming the female coupling member. The other half-shell 2 includes a projecting step $\mathbf{15}_2$ level with its male part, the two half-shells being twinned, as previously mentioned, but of hermaphroditic design so that they can be coupled together in a superposed position.

The male and female members that have just been described provided the "attachment" and "vent" function in the rear part of the two half-shells.

Latching is effected at the front by other means which simultaneously couple the two half-shells together and to the rear side $14_1$ of the connection housing 14 supporting the insulative block 13. Note that this insulative block is set far back from the male and female coupling members providing the "attachment" and "vent" function of the two half-shells so that material infiltrating to the interior of the shielded housing in the event of an overpressure has to travel some distance before reaching the electrical connections in the rear housing. The coupling of the half-shells 1 and 2 to the rear connection housing 14 is effected by the complementary shape of attachment tenons or claws 16 on the rear housing 14 and grooves stamped into each of the two sides 3 of the half-shells.

Each groove 17 extends along the front free edge 18 of the respective half-shell which has a semi-circular back $17_1$ (FIG. 4) to form a seat enabling it to pivot about the latching tenons 16 of the rear connection housing. Relative angular movement of one half-shell is shown in chain dotted line in FIG. 4.

The latching tenons 16 of the connection housing 14 are in the form of two lugs projecting from each side of the housing (FIG. 2) bent inwardly and extending beyond the front side $14_1$ of the rear housing.

These lugs provide mechanical interconnection of the shielded housing and the rear connection housing and perfect electrical continuity between the two housings.

Figure 4:
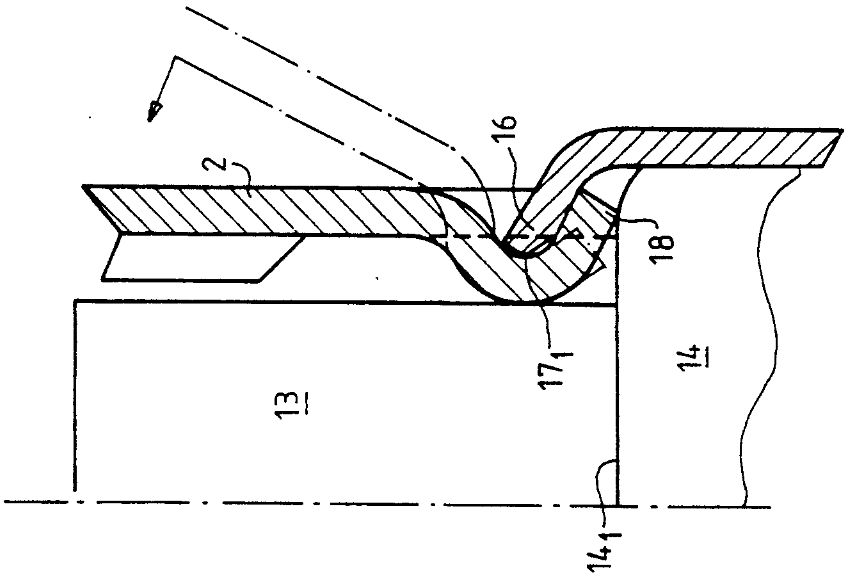
FIG. 4 is a view to a larger scale of the encircled part of FIG. 2.
Figure 2:
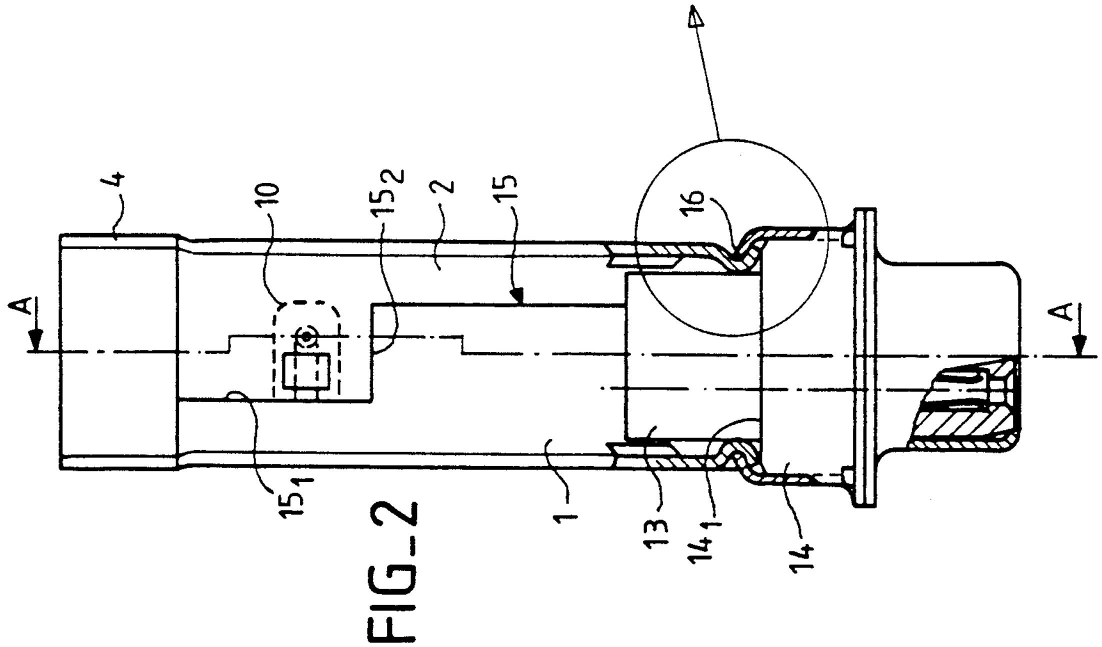
FIG. 2 is a view in cross-section on the line BB in FIG. 1.

Installation, by which is meant the coupling together of the two half-shells and their joining to the rear connection housing, is effected as shown in FIG. 4. Each of the two half-shells is offered up in an inclined position to insert its free edge 18 inside and under the latching lugs 16 which then engage in the respective groove 17. In this position, the two half-shells are simply pivoted towards each other until the snap-fastener studs 11 forming the male member of each half-shell engage in the cavity $10_1$ of the spring tang 10 constituting the female member of the opposite half-shell. This simple snap-fastener action locks the two half-shells at the front and at the rear and joins them to the rear connection housing 14. It then remains only to crimp the ferrule 5 to the circular sleeve formed by the coupling together of the two semi-cylindrical portions of the two half-shells before overmolding the insulative material to protect the electrical connector.

The design of this shielded housing procures many advantages from the points of view of manufacture, strength and convenience of use. The fact that the two half-shells are twinned means that a single cutting and stamping tool is sufficient, which significantly reduces manufacturing costs. The mechanical strength provided by the stiffener ribs on the housing and additionally and most importantly by the leakage authorized by the flexible tangs constituting the female members of the two half-shells prevents any distortion or destruction of the shielding without this discharge of pressure being able to damage the electrical connections inside the shielded housing. Electrical continuity is achieved simultaneously with the joining together of the shielded housing and the rear connection housing, preventing any RFI field. This electrical continuity is favored by the clean and straight front edge of the half-shells butted against the rear side of the connection housing.

Finally, the half-shells provided with tangs, ribs and grooves define, when assembled together, a closed volume enabling positive inlaying of the overmolded material. This guarantees adhesion of the overmolded jacket and that the connector is inviolable.

I claim:

1. An overmolded electrical connector comprising an insulative block, said insulative block receiving connecting members and being mechanically joined to a rear connection housing, said insulative block being protected by a first metal half-shell and a second metal half-shell adapted to be coupled together to form a shielded housing having electrical continuity with said rear connection housing, said rear connection housing being overmolded with an insulative material jacket
   - wherein both the first metal half-shell and the second metal half-shell are twinned and comprise a female member and a male snap-fastener member for coupling the first metal half-shell and the second metal half-shell together,
   - wherein at least one member selected from the group consisting of the female member of the first metal half-shell, the male snap-fastener member of the first metal half-shell, the female member of the second metal half-shell and the male snap-fastener member of the second metal half-shell further comprises an area which is at least in-part elastically deformable and adapted to face an aperture formed in the complementary member of the complementary metal half-shell, and
   - wherein at least one member selected from the group consisting of the female member of the first metal half-shell and the female member of the second metal half-shell further comprises a flexible tang cut out from a lateral skirt of the corresponding metal half-shell and a seat for snap-fastener engagement with the male member of the complementary metal half-shell, said flexible tang having a twofold attachment and vent function.

2. An overmolded electrical connector according to claim 1 wherein both the first metal half-shell and the second metal half-shell further comprise a front free edge and at least one groove, near the front free edge, adapted to cooperate with one or more tenons located on said rear connection housing.

3. An overmolded electrical connector according to claim 1 wherein the seat for snap-fastener engagement further comprises an oblong reinforcement whose back is planar and merges with an exterior wall of the lateral skirt of the corresponding metal half-shell through a flared edge, said oblong reinforcement being obtained by stamping and depressing a portion of the metal of the corresponding metal half-shell towards an interior of the corresponding metal half-shell.

4. An overmolded electrical connector according to claim 1 wherein the male snap-fastener member further comprises a snap-fastener stud projecting from an inside surface of a lateral skirt of the corresponding metal half-shell, the snap-fastener stud being positioned so that the snap-fastener stud faces both a reinforcement of the flexible tang of the female member of the complementary metal half-shell and an aperture formed in a lateral wall of the male snap-fastener member, said aperture being formed so as to be in line with the snap-fastener stud, the snap-fastener stud being positioned so as to be communicating with the flexible tang of the female member of the complementary metal half-shell.

5. An overmolded electrical connector according to claim 1 wherein the flexible tang of the female member further comprises an articulation area enabling the flexible tang of the female member to retract towards an interior of said shielded housing during an event of an overpressure during an overmolding of said insulative material jacket.

6. An overmolded electrical connector according to claim 2 wherein the electrical continuity between said shielded housing and said rear connection housing is achieved by clean and direct contact of both the front free edge of said first metal half-shell and the front free edge of said second metal half-shell with a rear side of said rear connection housing, the one or more tenons which are located on said rear connection housing being adapted to engage in the at least one groove.

7. An overmolded electrical connector according to claim 6 wherein the at least one groove in each metal half-shell is formed with a gutter-shape having a semicircular bottom whereby the at least one groove in each metal half-shell is adapted to pivot about the one or more tenons, which are located on said rear connection housing, in the form of an inwardly curved claw.

8. An overmolded electrical connector according to claim 7 wherein said rear connection housing includes on each of a front side and the rear sides two tenons spaced from each other, said two tenons projecting from a rear wall for coupling with said first metal half-shell and said second metal half-shell.

9. An overmolded electrical connector according to claim 6 wherein the front free edge of each metal half-shell is clean and straight and is adapted to be in contact with said rear side of said connection housing along an entire length of the front free edge.

10. An overmolded electrical connector according to claim 1 wherein each half-shell includes a plurality of stiffener ribs.

11. An overmolded electrical connector according to claim 10 wherein said plurality of stiffener ribs are arranged in a cruciform arrangement.

12. An overmolded electrical connector according to claim 1 wherein an area of contact between the first metal half-shell and the second metal half-shell where the first metal half-shell and the second metal half-shell mate together is discontinuous between the male snap-fastener members and the complimentary female members.

* * * * *